United States Patent [19]

Van Groningen

[11] Patent Number: 4,855,682
[45] Date of Patent: Aug. 8, 1989

[54] TRIGGER ARRANGEMENT SUITABLE FOR OSCILLSCOPES

[75] Inventor: Wilhelmus D. H. Van Groningen, Enschede, Netherlands

[73] Assignee: U.S. Philips Corporation, New York, N.Y.

[21] Appl. No.: 151,138

[22] Filed: Feb. 1, 1988

[30] Foreign Application Priority Data

Feb. 4, 1987 [NL] Netherlands ............... 8700267

[51] Int. Cl.$^4$ .................. H03K 1/17; H03K 7/00
[52] U.S. Cl. ............................. 328/63; 307/261; 307/228; 328/181
[58] Field of Search ........... 307/260, 261, 239, 228, 307/358, 364; 328/181-185, 59-61, 63, 289

[56] References Cited

U.S. PATENT DOCUMENTS

| | | | |
|---|---|---|---|
| 3,350,576 | 10/1967 | Zimmerman | 377/28 |
| 3,530,315 | 9/1970 | Kaufman | 307/228 |
| 3,558,930 | 1/1971 | Knapton | 307/228 |
| 3,649,852 | 3/1972 | Bohley | 307/289 |
| 3,725,792 | 4/1973 | Kellogg | 328/60 |
| 4,499,386 | 2/1985 | Schlotzhauer et al. | 307/260 |

*Primary Examiner*—Stanley D. Miller
*Assistant Examiner*—Richard Roseen
*Attorney, Agent, or Firm*—Bernard Franzblau

[57] ABSTRACT

A trigger arrangement suitable for use in oscilloscopes which include a cathode-ray tube as a change display device, a trigger output signal (10) is displayed from a trigger input signal (6) after the trigger arrangement is released by a release signal (8). Use is made of a series-combination of three bistable elements (2,4,16). The trigger input signal is applied in parallel to the bistable elements and the trigger output signal is obtained after the output of each bistable element has successively changed its state, a difference occurring between the switching levels of the successive bistable elements when the trigger input signal is applied to the bistable elements via differential amplifiers—assumed to be included in the bistable elements (2,4,16). The first two bistable elements (2,4) form an accurately defined release signal (17) for releasing the third bistable element (16). The instant of release of the third bistable element is thereby prevented from coinciding—up to vary high frequencies—with the instant at which the trigger input signal can cause the output (23) of the third bistable element to change its state after release of the third bistable element. In the case of an oscilloscope provided with such a trigger arrangement "jitter"-free signals can be displayed up to very high frequencies.

15 Claims, 3 Drawing Sheets

TRIGGER ARRANGEMENT SUITABLE FOR OSCILLSCOPES

BACKGROUND OF THE INVENTION

This invention relates to a trigger arrangement comprising a series-combination of a first and a second bistable element, an input of each of which is coupled to a trigger input for a trigger input signal, the trigger arrangement being provided with a release input for a release signal, which is coupled to at least one of the bistable elements, and with a trigger output for a trigger output signal, which assumes a first stable state when the release signal assumes a first value and which assumes a second stable state, which state is determined by the trigger input signal after the release signal has assumed a second value, and which state is assumed when an output of the first bistable element assumes a second stable state after the trigger signal exceeds a first level, whereupon an output of the second bistable element assumes a second stable state after the trigger input signal falls below a second level, which is lower than the first level.

Such a trigger arrangement can generally be used for producing trigger signals from a periodical signal at a predetermined level and at predetermined instants. Such a trigger arrangement is particularly suitable for use in oscilloscopes comprising as the display device a cathode-ray tube to permit operation up to high frequencies of the signal without the signal displayed by the display device moving (a so-called "jitter"-free image).

Such an arrangement is known from U.S. Pat. No. 3,649,852, in which a trigger arrangement is described especially intended to be used in oscilloscopes. The known arrangement comprises the said series-connected bistable elements to each of which the trigger input is coupled. Further, the arrangement comprises the release input, which is driven, for example, by a saw-tooth generator for producing a time base of an oscilloscope. As long as the release signal at the release input occurs with the first value, the trigger output has the first stable state. When the release signal then assumes the second value, the trigger output does not immediately respond thereto, but responds only after the output of the first bistable element has first assumed the second stable state after the trigger input signal has exceeded the first level and then the output of the second bistable element has assumed the second state after the trigger input signal falls below the second level. If the last-mentioned situation occurs, the trigger output assumes the second state. The saw-tooth generator to be driven, for example, by the trigger arrangement is started at the transition of the trigger output from the first state to the second state. The arrangement, of which the bistable elements are constituted, for example, by OR gates fed back via resistors and comprising emitter-coupled transistor logic elements, operates satisfactorily up to high frequencies. However, the arrangement no longer operates satisfactorily at very high frequencies because if the release signal passes from the first value to the second value immediately before the instant at which the trigger input signal exceeds the first level, the second bistable element is released at practically the same instant due to finite rise times of logic signals so that the instant of change also practically coincides therewith, which results in an uncertainty in the occurrence of the change at the trigger output with respect to the instant at which the second bistable element is released. Further, the instant at which, after release of the arrangement, the trigger output assumes the second state is fairly dependent upon the level difference between the first and the second level and upon the amplitude of the trigger input signal. In practical situations, it is moreover desirable that the amplitude of the trigger input signal be large with respect to, for example, the first and the second level, as a result of which the uncertainty increases even further.

SUMMARY OF THE INVENTION

An object of the invention is to provide an arrangement in which the said uncertainty does not occur or occurs, due to the rise times/fall times which are always present at the edges of signals, at least only at considerably higher frequencies than in the known arrangement. A trigger arrangement of the kind mentioned in the opening paragraph is for this purpose characterized in that the series-combination comprises a third bistable element, of which inputs are coupled to an output of the second bistable element and to the trigger input respectively, while an output of the third bistable element, which is coupled to the output of the trigger circuit, assumes the second state when the trigger signal exceeds the first level after the output of the second bistable element has assumed the second state. As a result, it is achieved that the said uncertainty does not occur due to the fact that the difference in time between the instant of release of the second bistable element and the instant of release of the third bistable element, which difference in time is determinative of the uncertainty, is substantially constant for a given input signal and is substantially independent of the said level difference and/or upon the amplitude of the trigger signal, so that the instant of release of the third bistable element by the second bistable element cannot coincide with the instant at which the trigger input signal can cause the third bistable element to change its state.

In known manner, the bistable elements can be constituted, for example, by logic OR gate circuits with feedback via resistors or by tunnel diodes. As a result, the arrangement can be constructed on the basis of standard elements. Further, the logic OR gates may be constructed with emitter-coupled logic circuits. Although it is also possible to use, for example, TTL (Transistor-Transistor-Logic), it is advantageous to employ emitter-coupled logic (ECL) because it is faster than TTL, as a result of which the arrangement can operate up to higher trigger input signal frequencies than would be the case with, for example, TTL.

An embodiment of an arrangement according to the invention, in which a first input of the first bistable element is coupled to a first output of a differential amplifier, a first input of the second bistable element is coupled to a second output of the differential amplifier and the release input is coupled to a second input of at least one of the first and second bistable elements and, in which the trigger input is coupled to a first input of the differential amplifier and a second input of the differential amplifier is coupled to an input terminal for connection of a reference voltage, is characterized in that a first input of the third bistable element is coupled to a first output of another differential amplifier and a second output of the other differential amplifier is coupled to a supply terminal for connection of a direct voltage, and in that the trigger input is coupled to a first input of the other differential amplifier and a second input of the other differential amplifier is coupled to another input terminal for connection of a reference voltage. Thus, it is achieved that the third bistable element, which is constructed, for example, as an OR gate with feedback through a resistor and driven from the other differential amplifier, to which the trigger input signal is also supplied, changes after release of the arrangement the output thereof from the first to the second state only after the third element has been released by the second element, which affords the advantages already mentioned with respect to the operation. The internal construction of the arrangement further ensures that the first bistable element responds to the first level when the trigger input signal exceeds the first level, that the second bistable element then responds to the second level when the trigger input signal falls below the second level and that the third bistable element then responds to the first level when the trigger input signal exceeds the first level. It should be noted once more that the first level is higher than the second level and that further in the case of ECL the first level has, for example, a positive potential with respect to a zero potential and the second level has, for example, a negative potential with respect to the zero potential.

A further embodiment of an arrangement according to the invention is characterized in that the release input is coupled to a second input of the third bistable element. If the release signal acts directly upon the third bistable element constructed, for example, as a gate with feedback, the trigger output passes to the first level with only one gate delay when the release signal assumes the first value. If, for example, the release signal is coupled only to the first bistable element, constructed as a gate with feedback, a delay time due to three gates is required before the trigger output assumes the first state.

BRIEF DESCRIPTION OF THE DRAWINGS

The invention will be described more fully with reference to the accompanying drawing, in which.

DESCRIPTION OF THE PREFERRED EMBODIMENTS

Figure 1:
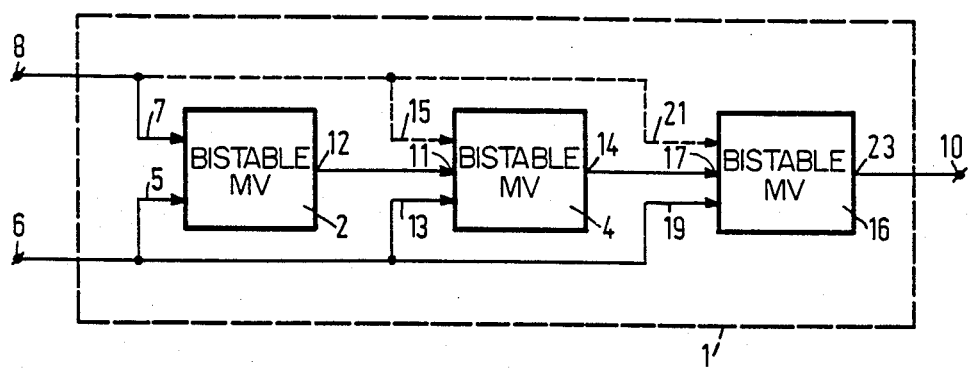
FIG. 1 shows a circuit diagram illustrating the principle of an arrangement according to the invention.

FIG. 1 shows a circuit diagram illustrating the principle of a trigger arrangement 1 according to the invention. The arrangement comprises a first bistable element 2, of which an input 5 is coupled to a trigger input 6. Another input 7 of the first bistable element 2 is coupled to a release input 8. In the context of trigger circuits for oscilloscopes, the term "release" means to be set into a condition to react to another signal. Further, the arrangement comprises a second bistable element 4, which is connected in series with the first bistable element 2 and has an input 11 coupled to an output 12 of the first bistable element 2. The second bistable element 4 has a further input 13, which is coupled to the trigger input 6, and an input 15, which may be coupled to the release input 8, as indicated by a broken line. The arrangement further comprises a third bistable element 16, which is connected in series with the second bistable element 4 and has an input 17 coupled to an output 14 of the second bistable element 4. The third bistable element 16 has a further input 19 which is coupled to the trigger input 6, and an input 21, which may be coupled to the release input 8. The trigger arrangement 1 is provided with an output 10 which is coupled to an output 23 of the third bistable element.

Figure 2:
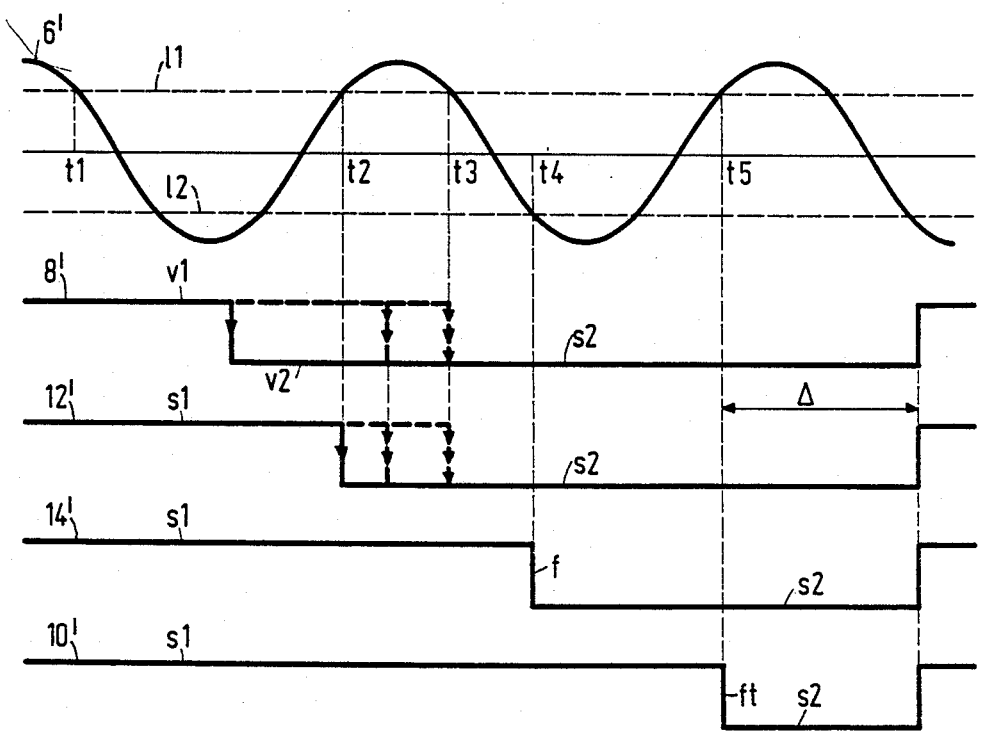
FIG. 2 illustrates a trigger input signal, a first and a second level and output signals of bistable elements for explanation of the operation of the arrangement shown in FIG. 1.

The operation of the arrangement will be described more fully with reference to FIG. 2 in which a trigger input signal $6'$ which is applied to the trigger input 6, together with a first level $l_1$ and a second level $l_2$ and output signals of the bistable elements 2, 4 and 16 are shown as a function of the time t. A few instants of time are designated $t_1$ to $t_5$. The first level $l_1$ is higher than the second level $l_2$. The difference between the levels $l_1$ and $l_2$ may be associated with a hysteresis effect. It is assumed that the arrangement is provided with supply terminals (not shown) for the application of supply voltages including ground. For the description of the operation it is assumed that the trigger input signal $6'$ is sinusoidal and that the sinusoidal trigger input signal $6'$ is applied to the trigger input 6, while the supply voltage is applied to the supply terminal. Signals associated with other connections are similarly designated by like reference numerals with primes. Furthermore, in an initial state, it is assumed that the arrangement is not released, a release signal $8'$ applied to the release input 8 having a first value $v_1$ and the outputs 12, 14 and 10 being in a first stable state $s_1$. The arrangement is released when the release signal $8'$ assumes a second value $v_2$. It is assumed that this happens after the instant $t=t_1$ and before the instant $t=t_3$, when the trigger input signal $6'$ falls below the first level $l_1$. When the release takes place between $t=t_1$ and the instant $t=t_2$ at which the signal $6'$ passes the level $l_1$, the output 12 of the first bistable element 2 changes its state at $t=t_2$ and the output signal $12'$ at the output 12 assumes a second bistable state $s_2$ at $t=t_2$. However, if release takes place between $t=t_2$ and $t=t_3$, the output signal $12'$ immediately assumes the state $s_2$. The output signal $12'$ cannot pass from the state $s_1$ to the state $s_2$ until the trigger input signal $6'$ exceeds the first level $l_1$. Associated signal edges are marked on the waveforms with one, two or three arrow points. The output signal $14'$ at the output 14 of the second bistable element 4 cannot change its state until the output signal $12'$ has assumed the state $s_2$. The output signal $12'$ is therefore to be interpreted as a release signal for the second bistable element 4. The output signal $14'$ further cannot pass from the state $s_1$ to the state $s_2$ until the trigger input signal $6'$ falls below the level $l_2$. This happens at the instant $t=t_4$.

Thus far, the operation of the arrangement is identical to that described in the aforementioned U.S. Pat. No. 3,649,852 in that, as appears from the above description, there is an interval $t_2 < t < t_3$ in which the second bistable element 4 can be released by the first bistable element 2 after which, at $t=t_4$, the output signal $14'$ of the second bistable element 4 passes from the first stable state $s_1$ to the second stable state $s_2$. If the second bistable element 4 is released immediately before the instant $t=t_3$ and the trigger input signal 6' has such a high frequency that the time difference $t_4-t_3$ is very small with respect to the finite fall time which is in practice inherent in the output signal 12', uncertainty will occur with respect to the instant of occurrence of an edge f of the output signal 14' because the instants at which the second bistable element 4 is released and at which this element responds then substantially coincide, which is manifested as the said "jitter" when the trigger arrangement is used for starting a saw-tooth generator (not shown) for horizontal deflection of a cathode ray in a cathode-ray tube oscilloscope.

The operation of a trigger arrangement according to the invention will now be described further. The output signal 10' at the output 23 of the third bistable element 16 cannot change after $t=t_4$ from the state $s_1$ to the state $s_2$ until the trigger input signal 6' exceeds the first level $l_1$ after the output signal 14' has assumed the state $s_2$. At $t=t_5$, the output signal 10' assumes the second stable state $s_2$ and then the trigger output signal is obtained, at which, for example, the saw-tooth generator is started. The time difference $t_5-t_4$ is always greater than the least time $t_4-t_3$ available, even with variation of the level difference between the first level $l_1$ and the second level $l_2$, which corresponds, for example, with a hysteresis effect. Further, the time difference $t_5-t_4$ is substantially independent of the amplitude of the trigger input signal 6' and in the case of, for example, a sinusoidal trigger input signal is substantially a half period of this signal. Summarizing, it may be said that the trigger arrangement according to the invention can operate up to considerably higher frequencies without the occurrence of uncertainty, with respect to the instant of occurrence of an edge ft in the trigger output signal 10', than a trigger arrangement which is provided with only two bistable elements. The present stateof the art, the satisfactory operation of the arrangement according to the invention up to maximum frequencies of up to 2 GHz is considered attainable. FIG. 2 further indicates that after a time Δ the release of the arrangement is eliminated due to the fact that after the time Δ the release signal 8' assumes the first value $v_1$. The release signal 8' is caused to reassume the first value $v_1$, for example by means of the said saw-tooth generator (not shown), in order that the saw-tooth generator is not started unintentionally during the horizontal deflection of the said cathode ray.

Figure 3:
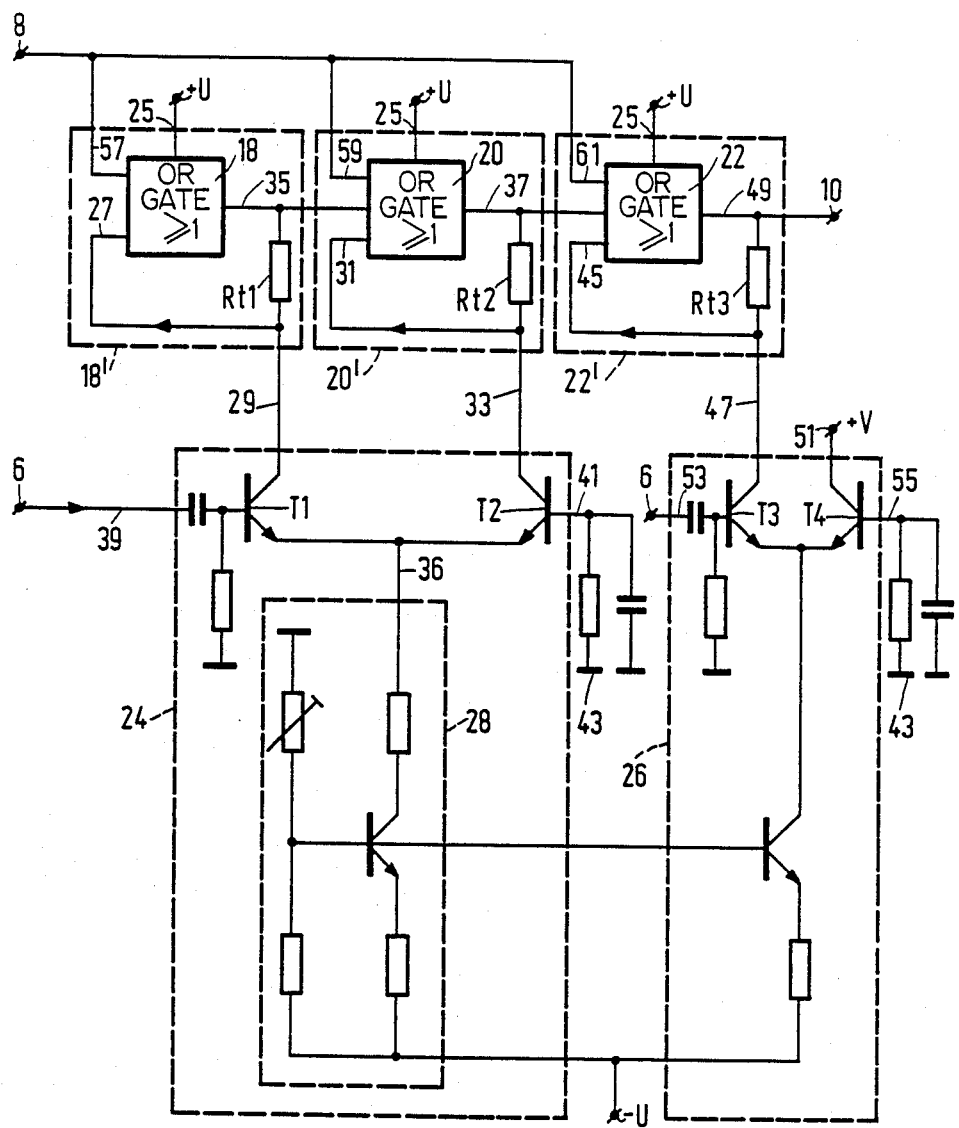
FIG. 3 shows in greater detail an embodiment of an arrangement according to the invention.

FIG. 3 shows an embodiment of an arrangement according to the invention, in which like connections 6, 8 and 10 are designated by the same reference numerals as in FIG. 1. In this embodiment, the bistable elements which are connected in series with each other and to which the trigger input 6 is connected in parallel are constituted by logic OR gates 18, 20 and 22, respectively, which receive feedback via resistors $R_{t1}$, $R_{t2}$ and $R_{t3}$, respectively, and are preferably in the form of ECL OR gates. For the construction and operation of an ECL OR gate with feedback, reference may be made, for example, to the general literature about this subject matter. Each logic OR gate 18, 20 and 22 is provided with a terminal 25 for connection of a supply voltage +U. Further supply connections required for an ECL gate are not shown here, but in this connection reference may be made to the literature. The embodiment further comprises a differential amplifier 24 and another differential amplifier 26. A first input 27 of a first bistable element 18' is coupled to a first output 29 of the differential amplifier 24 and a first input 31 of a second bistable element 20' is coupled to a second output 33 of the differential amplifier 24. Further, a resistor $R_{t1}$, which forms part of the first bistable element 18', is coupled at one end to the first output 29 of the differential amplifier and is coupled at its other end to an output 35 of the first bistable element 18', while a resistor $R_{t2}$, which forms part of the second bistable element 20', is coupled at one end to the second output 33 of the differential amplifier and is coupled at its other end to an output 37 of the second bistable element 20'. The differential amplifier 24 is constructed around two npn transistors $T_1$ and $T_2$, whose emitters are interconnected, while a common emitter lead 36 includes a current source 28, which is provided with a connection terminal −U for connection of a supply voltage. The construction of the current source 28 is in fact indicated in FIG. 3, but will not be further described herein. The trigger input 6, which is coupled to a first input 39 of the differential amplifier 24, is coupled via the base collector path of the transistor $T_1$ to the first bistable element 18' and is coupled via the base-emitter collector path of the transistors $T_1$ and $T_2$ to the second bistable element 20'. A second input 41 of the differential amplifier 24 is coupled to an input terminal for connection of a reference voltage, indicated in the embodiment as ground potential 43. A first input 45 of the third bistable element 22' is coupled to a first output 47 of the other differential amplifier 26. A resistor $R_{t3}$, which forms part of the third bistable element 22', is coupled at one end to the first output 47 of the other differential amplifier 26 and is coupled at its other end to an output 49 of the third bistable element 22'. A second output 51 of the differential amplifier 26 is coupled to a terminal +V for connection of a direct voltage. The other differential amplifier 26 is constructed around two npn transistors $T_3$ and $T_4$ and also has a construction similar to that of the differential amplifier 24. The trigger input 6, which is coupled to a first input 53 of the other differential amplifier 26, is coupled via the base-collector path of the transistor $T_3$ to the third bistable element 22'. A second input 55 of the other differential amplifier 26 is coupled to another input terminal for connection of a reference voltage, but in the embodiment the ground potential 43 already mentioned is indicated for the sake of simplicity. The release input 8 is coupled to a second input 57 of the first bistable element 18'. Preferably, the release input 8 is also coupled to a second input 59 and to a second input 61 of the second bistable element 20' and the third bistable element 22', respectively. The operation of the embodiment is as described with reference to FIG. 1, but will be explained more fully hereinafter with reference to FIG. 2. With the bistable elements 18', 20' and 22' constructed as ECL gates with feedback, an internal reference voltage (not shown) controls the change-over (i.e. the change of the stable state) of the gates. If it is assumed that the arrangement is not released (the release signal 8' at the inputs 57, 59 and 61 has the value $v_1$), the output signals 12', 14' and 10' at the outputs 35, 37 and 49, respectively, have the state $s_1$. From this situation, it is assumed that the release signal 8' assumes the second value $v_2$. As long as the trigger input signal 6' lies below the level $l_1$, even at a positive value of the trigger input signal 6' the current through the resistor $R_{t1}$ is not sufficient to cause the voltage at the first input 27 of the first bistable element 18' to fall below the internal reference voltage of the first bistable element 18' constructed as a ECL gate with feedback. When the trigger input signal 6' reaches the level $l_1$ (t=$t_2$), changeover of the first bistable element 18' takes place and the output signal 12' assumes the second state $s_2$. The remaining bistable elements 20' and 22' cannot change over from the state $s_1$ to the state $s_2$ because of the series arrangement, or as long as the first bistable element 18' is in the state $s_1$, the bistable elements 20' and 22' also remain in the state $s_1$, independently of the trigger input signal. Inter alia the choice of the value of the resistor $R_{t1}$ determines the level $l_1$. The current variation through the resistor $R_{t2}$ is opposite to the current variation through $R_{t1}$ because of the differential amplifier configuration so that the second bistable element 20' changes over at a value of the trigger input signal 6' which lies below the level $l_2$ (t=$t_4$). The current variation through the resistor $R_{t3}$ has the same sense as the current variation through the resistor $R_{t1}$. The third bistable element 22' therefore changes over at a level of the trigger input signal 6' which lies above the level $l_1$ (when the parameters of the differential amplifiers 24 and 26 are equal). For the further operation, reference may be made to the description of FIG. 1.

Figure 4A:
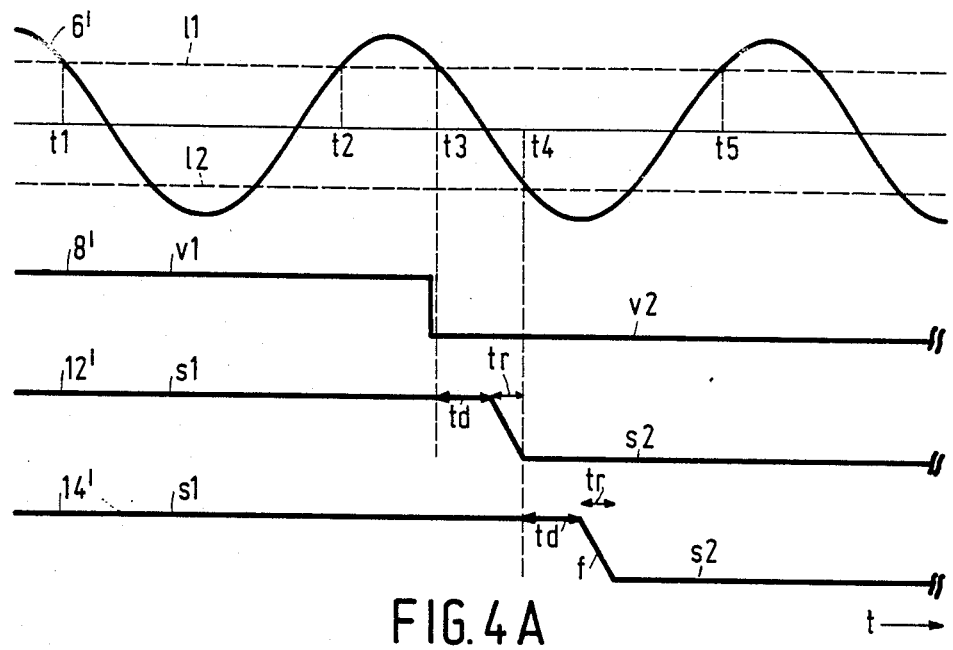
FIG. 4A illustrates signals associated with the change-over of the bistable elements in relation to the trigger input signal of a known two-stage trigger arrangement.
Figure 4B:
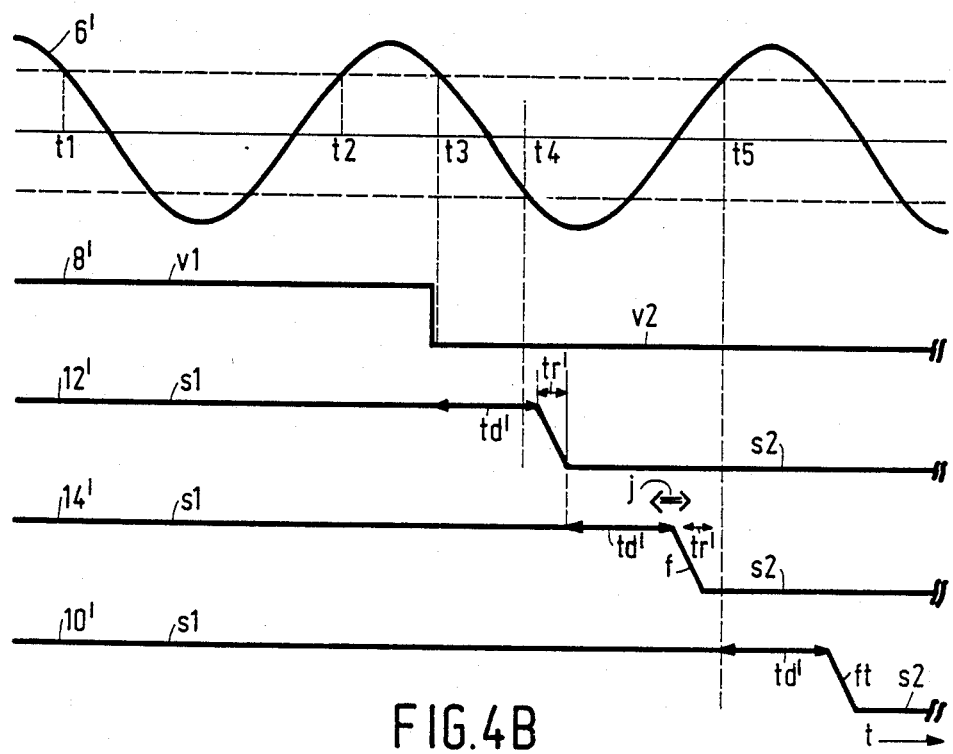
FIG. 4B illustrates for comparison the change-over of a three-stage trigger arrangement according to the invention.

FIGS. 4A and 4B show the change-over of the two and three bistable elements, respectively, in relation to the trigger input signal 6' in the case of a known two-stage trigger arrangement and in the case of the use of a three-stage trigger arrangement according to the invention, respectively. It is assumed in the embodiment described that an ECL gate has a delay time td and a fall time/rise time tr of an edge at the output. Further, it is assumed for the sake of simplicity that the fall time/rise time of the release signal 8' is negigible. Again the starting point is the situation in which the arrangement has just been released. In FIG. 4A, (td+tr)<($t_4$−$t_3$), where for a two-stage arrangement ($t_4$−$t_3$) is the minimum time within which the change-over of the first bistable element 18' must have taken place in order that uncertainty does not occur in the edge f of the second bistable element 20'. In FIG. 4A, this condition is just satisfied, whereas this condition is not satisfied in FIG. 4B. The situation as shown in FIG. 4B therefore leans to uncertainty with respect to the instant of occurrence of the edge f, which is indicated by a varying time duration j. However, in FIG. 4B, since the output 37 of the second bistable element 20' is stable before t=$t_5$ no uncertainty will occur with respect to the instant of occurrence of the edge ft of the output signal 10' of the third bistable element 22'. If the levels $l_1$ and $l_2$ are closer to each other than in the situation shown in FIG. 4A and in FIG. 4B, $t_4$−$t_5$ is even smaller and uncertainty will occur even sooner with a two-stage trigger arrangement. Uncertainty with a three-stage arrangement occurs only at very high frequencies. A similar consideration holds for variations in amplitude of the trigger input signal.

The invention is not limited to the embodiment shown, and many variations are possible for those skilled in the art without departing from the scope of the invention. For example, the bistable elements may be constructed in many ways and with different kinds of logic. Also, a construction on the basis of tunnel diodes as bistable elements may be realized without further inventive activity.

What is claimed is:

1. A trigger arrangement comprising, a series-combination of a first, a second and a third bistable element where the third bistable element has one input coupled to an output of the second bistable element, an input of each bistable element being coupled to a trigger input for a trigger input signal, a release input for a release signal coupled to at least one of the bistable elements, a trigger output for a trigger output signal coupled to an output of said third bistable element, said trigger output and said first, second and third bistable elements having a first stable state when the release signal is at a first value, and said trigger output assumes a second stable state determined by the trigger input signal and after the release signal has assumed a second value, wherein said second state of said trigger output occurs after an output of the first bistable element assumes a second stable state in response to the trigger signal exceeding a first level, whereupon an output of the second bistable element assumes a second stable state after the trigger input signal falls below a second level which is lower than the first level, wherein said third element assumes the second state when the trigger signal exceeds the first level after the output of the second bistable element has assumed the second state.

2. A trigger arrangement as claimed in claim 1, wherein a first input of the first bistable element is coupled to a first output of a first differential amplifier, a first input of the second bistable element is coupled to a second output of the first differential amplifier and the release input is coupled to a second input of at least one of the first and second bistable elements, the trigger input being coupled to a first input of the first differential amplifier and a second input of the first differential amplifier being coupled to an input terminal for connection of a reference voltage, characterized in that a first input of the third bistable element is coupled to a first output of a second differential amplifier and a second output of the second differential amplifier is coupled to a supply terminal for connection to a direct voltage, and in that the trigger input is coupled to a first input of the second differential amplifier and a second input of the second differential amplifier is coupled to another input terminal for connection of a reference voltage.

3. A trigger arrangement as claimed in claim 2, characterized in that the release input is coupled to another input of the third bistable element.

4. An oscilloscope comprising a trigger arrangement as claimed in claim 1

5. A trigger arrangement as claimed in claim 1, wherein the release input is coupled to another input of the third bistable element.

6. A trigger arrangement as claimed in claim 1 wherein said one bistable element that is coupled to the release input is the first bistable element in the series-combination.

7. A three-stage trigger circuit comprising: first, second and third bistable devices connected in cascade with an output of the first bistable device coupled to a first input of the second bistable device and an output of the second bistable device coupled to a first input of the third bistable device, means coupling an output terminal of the trigger circuit to an output of the third bistable device, a release input terminal for a release signal and coupled to at least a first input of the first bistable device, a trigger signal input terminal coupled to a second input of each of said bistable devices, said release signal having a first stable value at which said bistable devices are in a first stable state, said first, second and third bistable devices being in a first stable state so long as the first and second bistable devices are in a first stable state, respectively, said second and third bistable devices switching over to a second stable state in synchronism with the trigger signal only after the first and second bistable devices, respectively, have switched to the second stable state, said first bistable device switching from the first stable state to the second stable state in synchronim with the trigger signal provided that the release signal is at a second value, said first, second and third bistable devices being switched to the second bistable state in sequence whereby the trigger circuit output terminal switches from a first level to a second level when the third bistable device switches from the first to the second bistable state.

8. A trigger circuit as claimed in claim 7 wherein the trigger input terminal is coupled directly to the second input of each of said first and third bistable devices so that first and third bistable devices receive the trigger signal substantially simultaneously.

9. A trigger circuit as claimed in claim 7 further comprising means for coupling said release input terminal to a further input of said second and third bistable devices.

10. A trigger circuit as claimed in claim 7 wherein said trigger signal is a periodic signal, said first bistable device being triggered from the first stable state to the second stable state at a first level of the trigger signal and the second bistable device being triggered from the first stable state to the second stable state at a second level of the trigger signal that is different from said first level.

11. A trigger circuit as claimed in claim 7 wherein the trigger input terminal is coupled directly to the second input of each of said first, second and third bistable devices so that the bistable devices receive the trigger signal substantially simultaneously but are switched from the first to the second bistable state in timed sequence.

12. A trigger circuit as claimed in claim 7 further comprising first and second differential amplifiers each having first and second inputs and first and second outputs, wherein said trigger input terminal is coupled to the respective second inputs of said bistable devices by coupling said trigger input terminal to the first input of said first and second differential amplifiers and by coupling said first and second outputs of the first differential amplifier to the second input of the first and second bistable devices, respectively, and by coupling a first output of the second differential amplifier to the second input of the third bistable device, and means coupling the second output of the second differential amplifier to a DC supply voltage terminal and the second inputs of the first and second differential amplifiers to a source of reference voltage.

13. A trigger circuit as claimed in claim 12 wherein each of said bistable devices comprises a logic OR circuit with a feedback resistor and said release input terminal is coupled to respective third inputs of the second and third bistable device.

14. A trigger circuit as claimed in claim 13 wherein each differential amplifier comprises first and second emitter-coupled transistors with the emitters connected to a current source.

15. A trigger arrangement as claimed in claim 1 wherein said bistable elements are coupled to the trigger input such that the trigger input signal is applied to said input of each bistable device substantially simultaneously.

* * * * *